(12) United States Patent
Saito

(10) Patent No.: US 6,977,949 B2
(45) Date of Patent: Dec. 20, 2005

(54) CONTROL CIRCUIT FOR CONSTANTLY SETTING OPTICAL OUTPUT OF SEMICONDUCTOR LASER

(75) Inventor: Kyozo Saito, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 209 days.

(21) Appl. No.: 10/656,049

(22) Filed: Sep. 5, 2003

(65) Prior Publication Data

US 2004/0057478 A1 Mar. 25, 2004

(30) Foreign Application Priority Data

Sep. 20, 2002 (JP) .............................. 2002-275447

(51) Int. Cl.[7] .............................................. H01S 3/00
(52) U.S. Cl. ................................ 372/38.02; 372/38.07
(58) Field of Search ............................ 372/34, 38.02, 372/38.07

(56) References Cited

U.S. PATENT DOCUMENTS

| | | | | |
|---|---|---|---|---|
| 4,484,331 A | * | 11/1984 | Miller | 372/34 |
| 4,639,924 A | * | 1/1987 | Tsunekawa | 372/33 |
| 4,876,442 A | * | 10/1989 | Fukushima | 250/205 |
| 5,334,826 A | * | 8/1994 | Sato et al. | 235/462.06 |
| 5,479,425 A | * | 12/1995 | Tegge | 372/34 |
| 5,499,258 A | * | 3/1996 | Kawano et al. | 372/34 |
| 5,740,191 A | * | 4/1998 | Kasper et al. | 372/34 |
| 5,761,230 A | * | 6/1998 | Oono et al. | 372/38.01 |
| 5,844,928 A | * | 12/1998 | Shastri et al. | 372/38.02 |
| 6,055,252 A | * | 4/2000 | Zhang | 372/34 |
| 6,195,371 B1 | * | 2/2001 | Haneda et al. | 372/29.01 |
| 6,292,497 B1 | * | 9/2001 | Nakano | 372/29.015 |
| 6,362,910 B1 | * | 3/2002 | Tokita | 398/183 |
| 6,559,995 B2 | * | 5/2003 | Tokita | 398/182 |

FOREIGN PATENT DOCUMENTS

JP H5-259563 10/1993

* cited by examiner

Primary Examiner—Minsun O. Harvey
Assistant Examiner—Phillip Nguyen
(74) Attorney, Agent, or Firm—Brinks Hofer Gilson & Lione

(57) ABSTRACT

An optical output control circuit has a semiconductor laser for supplying a modulating electric current and a bias electric current thereto, a modulating electric current supplying device for supplying the modulating electric current on the basis of an inputted modulating signal, and a bias electric current supplying device for supplying the bias electric current. A first temperature correcting device for increasing the modulating electric current with a rise in ambient temperature is arranged in the modulating electric current supplying device, and a second temperature correcting circuit for increasing the bias electric current with the rise in ambient temperature is arranged in the bias electric current supplying device.

6 Claims, 2 Drawing Sheets

CONTROL CIRCUIT FOR CONSTANTLY SETTING OPTICAL OUTPUT OF SEMICONDUCTOR LASER

This application claims the benefit of priority to Japanese Patent Application 2002-275447, filed on Sep. 20, 2002.

BACKGROUND OF THE INVENTION

1. Field of the Invention

The present invention relates to an optical output control circuit of a semiconductor laser for constantly setting the optical output of the semiconductor laser irrespective of ambient temperature.

2. Description of the Related Art

FIG. 4 shows an optical output control circuit of a conventional semiconductor laser. A reference voltage Vref is applied to the base of a transistor 42 for flowing a modulating electric current to the semiconductor laser 41, and its emitter is connected to the emitter of a transistor 43 having a base to which a pulse signal for modulation is inputted. These two emitters are connected to the collector of a transistor 44, and an operational amplifier 45 is arranged between the base and the emitter of the transistor 44. The voltage of an emitter resistor 46 of the transistor 44 is inputted to the operational amplifier 45. Further, negative feedback is applied to an inversion input terminal (−) of the operational amplifier 45 by a thermistor 47. A non-inversion input terminal (+) of the operational amplifier 45 is connected to the ground by a thermistor 48.

In the above construction, the transistors 42 and 43 are alternately turned on/off by a continuous pulse signal so that the modulating electric current is flowed to the semiconductor laser 41. Further, since the thermistors 47, 48 are connected to the operational amplifier 45, the semiconductor laser 41 is operated such that the modulating electric current flowed to the semiconductor laser 41 is increased correspondingly with a rise in temperature. Thus, the optical output is constantly set even when the semiconductor laser 41 is reduced in efficiency.

Further, one portion of the optical output of the semiconductor laser 41 is detected by a light receiving element 50. The detected voltage is inputted to an optical output control circuit 51. The optical output control circuit 51 operates a transistor 52 for flowing a bias electric current to the semiconductor laser 41 such that the optical output of the semiconductor laser 41 is constant irrespective of the ambient temperature. Namely, if the detected voltage is reduced by a reduction in efficiency of the semiconductor laser 41 caused by the rise in temperature, the optical output control circuit 51 controls the operation of the transistor 52 so as to compensate for this reduction in the detected voltage so that the bias electric current is increased (see Patent Literature 1).

[Patent Literature 1]

Japanese Unexamined Published Patent Application No. H5-259563 (FIG. 1)

The level of the optical output outputted from the semiconductor laser 41 is determined by a sum of the bias electric current and the modulating electric current. Therefore, if the pulse signal for modulation is continuously inputted in the above construction, the modulating electric current and the bias electric current are changed dependently on temperature. Accordingly, the optical output level is controlled by the optical output control circuit 51 such that the optical output level is constant at all times. However, when the pulse signal for modulation is inputted in a so-called burst shape, no modulating electric current is flowed to the semiconductor laser 41 in a period in which no pulse signal for modulation is inputted. Accordingly, no electric current is flowed to the light receiving element 50 so that the optical output control circuit 51 increases the flow electric current to the semiconductor laser 41 to a maximum. As this result, there is a problem of destroying the semiconductor laser 41. Accordingly, no semiconductor laser can be used in the burst mode in the conventional construction.

SUMMARY OF THE INVENTION

An object of the present invention is to provide a control circuit in which the modulating electric current and the bias electric current supplied to the semiconductor laser can be respectively changed correspondingly with the ambient temperature even in the burst mode, and the optical output level is constantly set at all times irrespective of the ambient temperature.

To solve the above problems, the present invention resides in an optical output control circuit of a semiconductor laser comprising the semiconductor laser for supplying a modulating electric current and a bias electric current thereto, modulating electric current supplying means for supplying the modulating electric current on the basis of an inputted modulating signal, and bias electric current supplying means for supplying the bias electric current, wherein first temperature correcting means for increasing the modulating electric current with a rise in ambient temperature is arranged in the modulating electric current supplying means, and a second temperature correcting circuit for increasing the bias electric current with the rise in ambient temperature is arranged in the bias electric current supplying means.

Further, the feedback circuit is constr-ucted by a transistor for flowing the bias electric current to the semiconductor laser, a seventh resistor connected between the emitter of the transistor and the ground, and an operational amplifier interposed between the second temperature correcting means and the base of the transistor, and the divided voltage is applied to a non-inversion input terminal of the operational amplifier, and the emitter of the transistor is connected to an inversion input terminal of the operational amplifier.

Further, the first temperature correcting means is constructed by a first resistor circuit constructed by a first thermistor, a first resistor connected in series to the first thermistor, and a second resistor connected in parallel to the first thermistor, and is also constructed by a third resistor connected in series to the first resistor circuit, and the second temperature correcting means is constructed by a second resistor circuit constructed by a second thermistor, a fourth resistor connected in series to the second thermistor, and a fifth resistor connected in parallel to the second thermistor, and is also constructed by a sixth resistor connected in series to the second resistor circuit, and the modulating signal is inputted between both terminals of the first temperature correcting means, and a direct current voltage is applied between both terminals of the second temperature correcting means, and the modulating electric current is supplied by the modulating signal outputted between both ends of the third resistor, and the bias electric current is supplied by a divided voltage outputted between both ends of the sixth resistor.

Further, the feedback circuit is constructed by a transistor for flowing the bias electric current to the semiconductor laser, a seventh resistor connected between the emitter of the transistor and the ground, and an operational amplifier interposed between the second temperature correcting means and the base of the transistor, and the divided voltage is applied to a non-inversion input terminal of the operational amplifier, and the emitter of the transistor is connected to an inversion input terminal of the operational amplifier.

DESCRIPTION OF THE PREFERRED EMBODIMENTS

Figure 1:
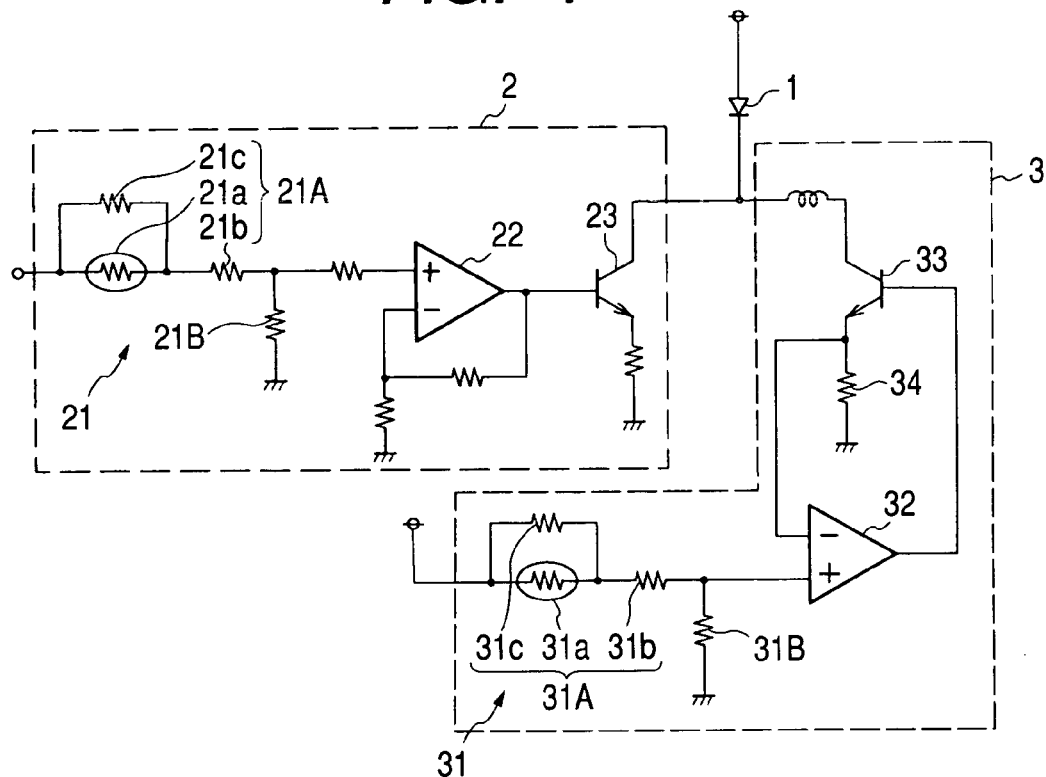
FIG. 1 is a circuit diagram showing the construction of an optical output control circuit of a semiconductor laser of the present invention.
Figure 2:
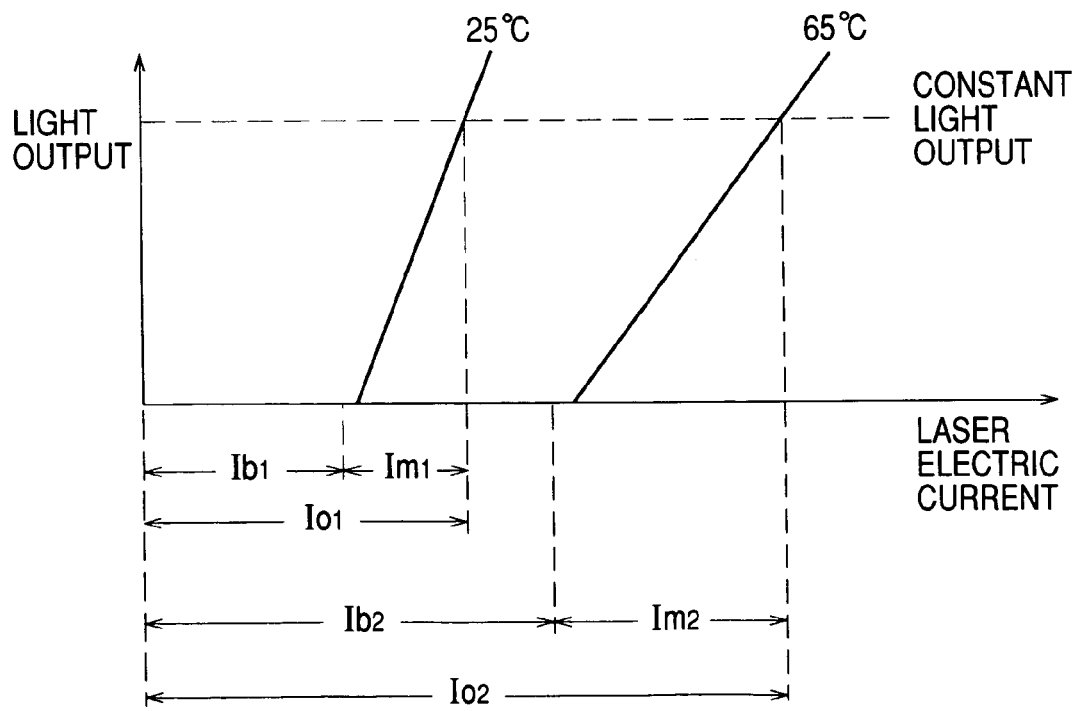
FIG. 2 is an optical output characteristic view of the semiconductor laser.
Figure 3:
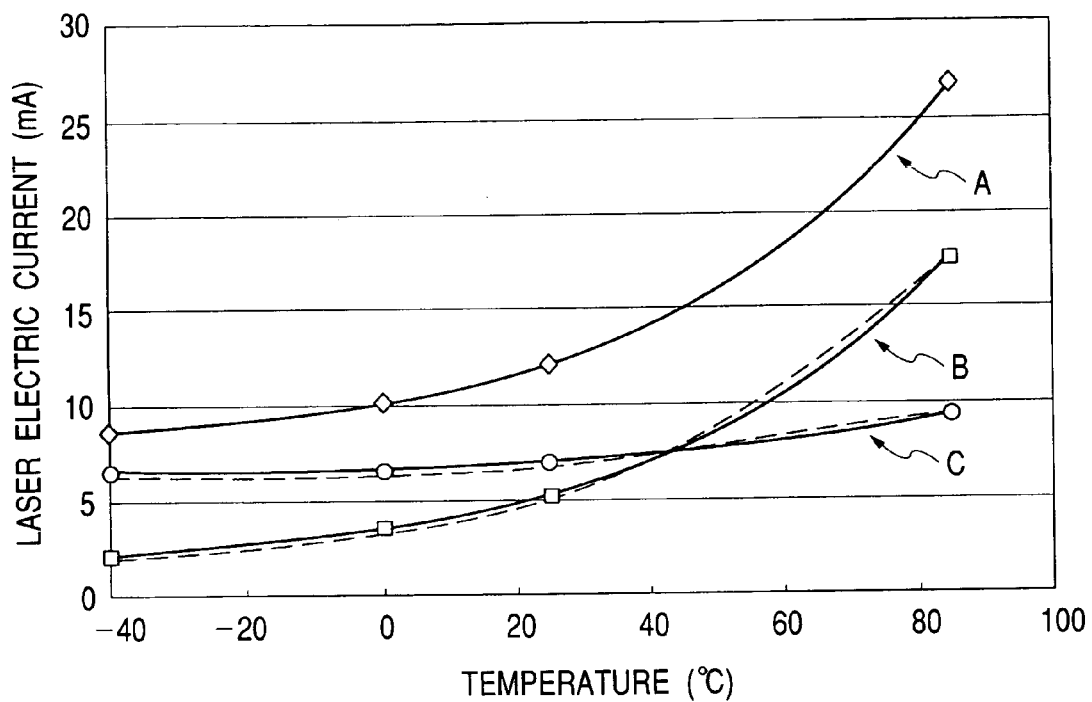
FIG. 3 is a temperature characteristic view of a modulating electric current and a bias electric current supplied to the semiconductor laser in the optical output control circuit of the semiconductor laser of the invention.
Figure 4:
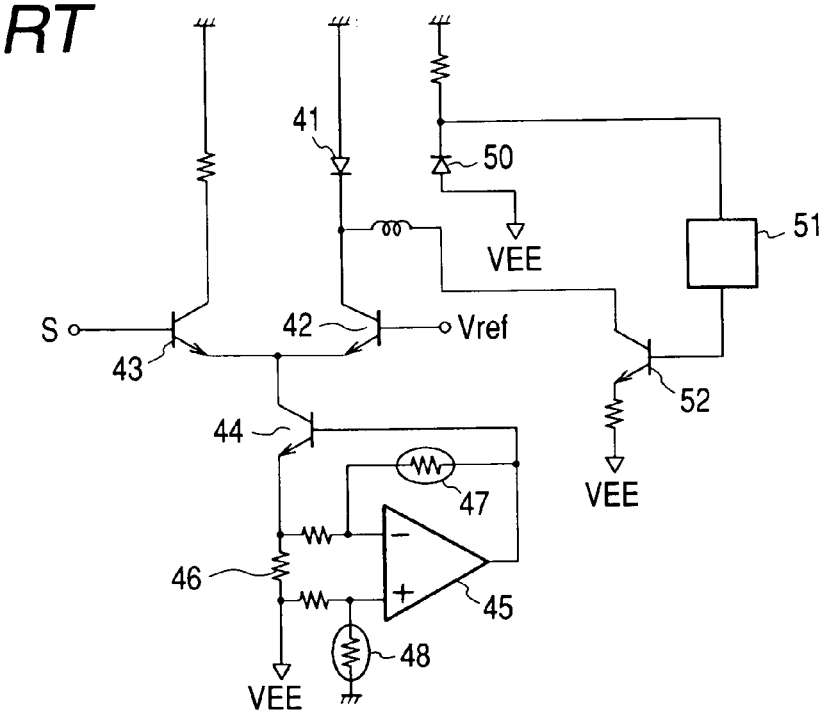
FIG. 4 is a circuit diagram showing the construction of the optical output control circuit of a conventional semiconductor laser.

An optical output control circuit of a semiconductor laser of the invention will be explained in accordance with FIGS. 1 to 3. FIG. 1 shows the construction of the optical output control circuit of the semiconductor laser of the present invention. FIG. 2 shows optical output characteristics of the semiconductor laser. FIG. 3 shows temperature characteristics of a modulating electric current and a bias electric current supplied to the semiconductor laser.

In FIG. 1, the modulating electric current is supplied from a modulating electric current supplying means 2 to the semiconductor laser 1, and the bias electric current is supplied from a bias electric current supplying means 3 to the semiconductor laser 1.

The optical output level of the semiconductor laser 1 is determined by a total electric current (Io) flowed to this semiconductor laser 1. However, the electric current (bias electric current Ib) before and after a light transmission start is normally flowed to the semiconductor laser 1 at all times, and light is emitted for a short time by superposing the demodulating electric current (Im) of a pulse shape on this electric current. Further, the optical output control circuit has a property in which light emitting efficiency is reduced as ambient temperature rises as shown in FIG. 2. Accordingly, in order to obtain a constant optical output, a large electric current is required as the temperature rises.

For example, at 25° C., the bias electric current Ib1 among the required total electric current Io1 is supplied at all times, and the demodulating electric current Im1 is superposed on this bias electric current. If the temperature rises to 65° C., the required total electric current Io2, the bias electric current Ib2 and the demodulating electric current Im2 are increased. In FIG. 3, the various electric currents required in the semiconductor laser 1 are calculated by the actual measurement as to how these electric currents are changed in accordance with the temperature. The solid line of A of FIG. 3 shows the total electric current (Io) and the solid line of B shows the bias electric current (Ib), and the solid line of C shows the demodulating electric current (Im).

The demodulating electric current supplying means 2 has a first temperature correcting means 21 for setting the demodulating electric current, a first operational amplifier 22 arranged at the next stage of the first temperature correcting means 21, and a first transistor 23 arranged at the next stage of the first operational amplifier 22.

The first temperature correcting means 21 is constructed by a first resistor circuit 21A and a third resistor 21b connected in series to the first resistor circuit 21A. The first resistor circuit 21A is constructed by a first thermistor 21a, a first resistor 21b connected in series to the first thermistor 21a, and a second resistor 21c connected in parallel to the first thermistor 21a. A voltage dividing circuit is constructed by the first resistor circuit 21A and the third resistor 21B. The modulating signal of a pulse shape is inputted to one end of the first resistor circuit 21A side, and the other end of the first resistor 21B side is connected to the ground. The demodulating signal divided in voltage is outputted from the connection point of the first resistor circuit 21A and the third resistor 21B.

The demodulating signal is inputted to a non-inversion input terminal (+) of the first operational amplifier 22. The demodulating signal outputted from the first operational amplifier 22 is inputted to the base of a first transistor 23. The collector of the first transistor 23 is connected to the semiconductor laser 1, and the emitter of the first transistor 23 is connected to the ground through a resistor.

Accordingly, the first transistor 23 is repeatedly turned on/off by the demodulating signal, and the demodulating electric current (Im) is supplied to the semiconductor laser 1 at the turning-on time of the first transistor 23.

Here, when the thermistor constant of the first thermistor 21a is selectively set to 6000 K, and the resistance values of the first to third resistors 21b, 21c and 21B are respectively selectively set to 1 KΩ, 3 kΩ and 6.85 Ω, the demodulating electric current (Im) is provided as shown by the dotted line of C of FIG. 3 and characteristics very approximate to the characteristics of the solid line within 1.5% at its maximum are obtained.

The bias electric current supplying means 3 has a second temperature correcting means 31, a second operational amplifier 32 arranged at the next stage of the second temperature correcting means 31, and a second transistor 33 arranged at the next stage of the second operational amplifier 32.

The second temperature correcting means 31 has a construction similar to that of the first temperature correcting means 21 for setting the bias electric current. Accordingly, the second temperature correcting means 31 is constructed by a second resistor circuit 31A and a sixth resistor 31B connected in series to the second resistor circuit 31A. The second resistor circuit 31A is constructed by a second thermistor 31a, a fourth resistor 31b connected in series to this second thermistor 31a, and a fifth resistor 31c connected in parallel to the second thermistor 31a. A voltage dividing circuit is constructed by the second resistor circuit 31A and the sixth resistor 31B. A direct current voltage for bias is applied to one end of the second resistor circuit 31A side, and the other end of the sixth resistor 31B side is connected to the ground. A bias voltage divided in voltage is outputted from the connection point of the second resistor circuit 31A and the sixth resistor 21B.

The bias voltage is inputted to the non-inversion input terminal (+) of a second operational amplifier 32. The bias voltage outputted from the second operational amplifier 32 is applied to the base of a second transistor 33. The collector of the second transistor 33 is connected to the semiconductor laser 1, and the emitter of the second transistor 33 is connected to the ground through a seventh resistor 34. The emitter of the second transistor 33 is connected to an inversion input terminal (−) of the second operational amplifier 32.

Accordingly, the second transistor 23 is turned on by the bias voltage, and the bias electric current (Ib) is supplied to the semiconductor laser 1.

Here, when the thermistor constant of the second thermistor 31a is selectively set to 3700 K, and the resistance values of the fourth to sixth resistors 31b, 31c and 31B are respectively selectively set to 115 Ω, 6.17 kΩ and 287 Ω, the bias electric current (Ib) is provided as shown by the dotted line of B of FIG. 3 and characteristics very approximate to the characteristics of the solid line within 1.5% at its maximum are obtained.

Since the emitter of the second transistor 33 is connected to the inversion input terminal (−) of the second operational amplifier 32, negative feedback is applied to the second operational amplifier 32 by the voltage generated in the seventh resistor on the basis of the bias electric current (Ib). Accordingly, even when the second transistor 33 has a temperature depending property, control is performed such that the bias electric current (Ib) set by the second temperature correcting means 31 is constant.

As explained above, in the present invention, the first temperature correcting means for increasing the modulating electric current with the rise in ambient temperature is arranged in the modulating electric current supplying means for supplying the modulating electric current to the semiconductor laser. The second temperature correcting circuit for increasing the bias electric current with the rise in ambient temperature is arranged in the bias electric current supplying means for supplying the bias electric current to the semiconductor laser. Therefore, the modulating electric current and the bias electric current can be respectively independently changed correspondingly with temperature. Accordingly, the level of an optical output can be always constantly set irrespective of the ambient temperature even in a burst mode in which existing and non-existing periods of the modulating signal are mixed with each other.

Further, since the feedback circuit negatively fed back by the bias electric current is arranged in the bias electric current supplying means, the bias electric current set by the second temperature correcting means 31 is controlled so as to be constant.

Further, the first temperature correcting means is constructed by a first resistor circuit including a first thermistor, and a third resistor connected in series to the first resistor circuit. The second temperature correcting means is constructed by a second resistor circuit including a second thermistor, and a sixth resistor connected in series to the second resistor circuit. The modulating signal is inputted to the first temperature correcting means, and a direct current voltage is applied to the second temperature correcting means. The modulating electric current is supplied by the modulating signal outputted to the third resistor. The bias electric current is supplied by a divided voltage outputted to the sixth resistor. Accordingly, the modulating electric current and the bias electric current of a required temperature depending property can be supplied to the semiconductor laser.

Further, the feedback circuit is constructed by a transistor for flowing the bias electric current to the semiconductor laser, a seventh resistor connected between the emitter of the transistor and the ground, and an operational amplifier interposed between the second temperature correcting means and the base of the transistor. The divided voltage is applied to a non-inversion input terminal of the operational amplifier, and the emitter of the transistor is connected to an inversion input terminal of the operational amplifier. Accordingly, the negative feedback circuit can be constructed by using a second transistor as it is.

What is claimed is:

1. An optical output control circuit of a semiconductor laser comprising:

the semiconductor laser receiving a modulating electric current and a bias electric current;

modulating electric current supplying means for supplying said modulating electric current on the basis of an inputted modulating signal; and bias electric current supplying means for supplying said bias electric current, wherein first temperature correcting means for increasing said modulating electric current with a rise in ambient temperature is arranged in said modulating electric current supplying means, a second temperature correcting means for increasing said bias electric current with said rise in ambient temperature is arranged in said bias electric current supplying means, a feedback circuit negatively fed back by said bias electric current is arranged in said bias electric current supplying means, said first temperature correcting means is constructed by a first resistor circuit constructed by a first thermistor, a first resistor connected in series to said first thermistor, and a second resistor connected in parallel to said first thermistor, and is also constructed by a third resistor connected in series to said first resistor circuit, said second temperature correcting means is constructed by a second resistor circuit constructed by a second thermistor, a fourth resistor connected in series to said second thermistor, and a fifth resistor connected in parallel to said second thermistor, and is also constructed by a sixth resistor connected in series to said second resistor circuit, said modulating signal is inputted between both terminals of said first temperature correcting means, a direct current voltage is applied between both terminals of said second temperature correcting means, said modulating electric current is supplied by the modulating signal outputted between said third resistor and the first resistor circuit, and said bias electric current is supplied by a divided voltage outputted between said sixth resistor and the second resistor circuit.

2. An optical output control circuit of a semiconductor laser comprising:

the semiconductor laser receiving a modulating electric current and a bias electric current;

modulating electric current supplying means for supplying said modulating electric current on the basis of an inputted modulating signal; and bias electric current supplying means for supplying said bias electric current, wherein first temperature correcting means for increasing said modulating electric current with a rise in ambient temperature is arranged in said modulating electric current supplying means, a second temperature correcting means for increasing said bias electric current with said rise in ambient temperature is arranged in said bias electric current supplying means, a feedback circuit negatively fed back by said bias electric current is arranged in said bias electric current supplying means, said feedback circuit is constructed by a transistor for flowing said bias electric current to said semiconductor laser, a seventh resistor connected between an emitter of said transistor and ground, and an operational amplifier interposed between said second temperature correcting means and a base of said transistor, and a divided voltage is applied to a non-inversion input terminal of said operational amplifier, and the emitter of said transistor is connected to an inversion input terminal of said operational amplifier.

3. The optical output control circuit of the semiconductor laser according to claim 2, wherein:

said first temperature correcting means is constructed by a first resistor circuit constructed by a first thermistor, a first resistor connected in series to said first thermistor, and a second resistor connected in parallel to said first thermistor, and is also constructed by a third resistor connected in series to said first resistor circuit, said second temperature correcting means is constructed by a second resistor circuit constructed by a second thermistor, a fourth resistor connected in series to said second thermistor, and a fifth resistor connected in parallel to said second thermistor, and is also constructed by a sixth resistor connected in series to said second resistor circuit, said modulating signal is inputted between both terminals of said first temperature correcting means, a direct current voltage is applied between both terminals of said second temperature correcting means, said modulating electric current is supplied by the modulating signal outputted between said third resistor and the first resistor circuit, and said bias electric current is supplied by a divided voltage outputted between said sixth resistor and the second resistor circuit.

4. An output control circuit comprising:

a modulating electric current supplier configured to receive a modulating signal and supply a modulating electric current, the modulating electric current supplier containing a first temperature corrector that increases the modulating electric current as an ambient temperature rises; and a bias electric current supplier that supplies a bias electric current, the bias electric current supplier containing a second temperature corrector that increases the bias electric current as the ambient temperature rises, wherein the first temperature corrector has a first resistor circuit and a first resistor connected in series to the first resistor circuit, the first resistor circuit includes a first thermistor, a second resistor connected in series to the first thermistor, and a third resistor connected in parallel to the first thermistor, the modulating signal is supplied to an input between terminals of the first temperature corrector, the modulating electric current is supplied by a modulating signal provided to an output between ends of the first resistor, and the second temperature corrector has a second resistor circuit and a fourth resistor connected in series to the second resistor circuit, the second resistor circuit includes a second thermistor, a fifth resistor connected in series to the second thermistor, and a sixth resistor connected in parallel to the second thermistor, a direct current voltage is applied between terminals of the second temperature corrector, the bias electric current is supplied by a divided voltage provided to an output between the fourth resistor and the first resistor circuit.

5. An output control circuit comprising:

a modulating electric current supplier configured to receive a modulating signal and supply a modulating electric current, the modulating electric current supplier containing a first temperature corrector that increases the modulating electric current as an ambient temperature rises; and a bias electric current supplier that supplies a bias electric current, the bias electric current supplier containing a second temperature corrector that increases the bias electric current as the ambient temperature rises and a feedback circuit negatively fed back by the bias electric current, wherein the feedback circuit contains a transistor that supplies the bias electric current, a first resistor connected between an output terminal of the transistor and ground, and an operational amplifier interposed between the second temperature corrector and a control terminal of the transistor, a divided voltage is applied to a non-inversion input terminal of the operational amplifier, and the emitter of the transistor is connected to an inversion input terminal of the operational amplifier.

6. The output control circuit of claim 5, wherein:

the first temperature corrector has a first resistor circuit and a second resistor connected in series to the first resistor circuit, the first resistor circuit includes a first thermistor, a third resistor connected in series to the first thermistor, and a fourth resistor connected in parallel to the first thermistor, the modulating signal is supplied to an input between terminals of the first temperature corrector, the modulating electric current is supplied by a modulating signal provided to an output between ends or the second resistor, and the second temperature corrector has a second resistor circuit and a fifth resistor connected in series to the third resistor circuit, the second resistor circuit includes a second thermistor, a sixth resistor connected in series to the second thermistor, and a seventh resistor connected in parallel to the second thermistor, a direct current voltage is applied between terminals of the second temperature corrector, the bias electric current is supplied by a divided voltage provided to an output between the fifth resistor and the second resistor circuit.

* * * * *